(12) United States Patent
Wu

(10) Patent No.: US 11,062,746 B1
(45) Date of Patent: Jul. 13, 2021

(54) COMPUTER PROGRAM PRODUCT AND METHOD AND APPARATUS FOR ACTIVATING FLASH DEVICES

(71) Applicant: Silicon Motion, Inc., Zhubei (TW)

(72) Inventor: Po-Wei Wu, New Taipei (TW)

(73) Assignee: SILICON MOTION, INC., Zhubei (TW)

( * ) Notice: Subject to any disclaimer, the term of this patent is extended or adjusted under 35 U.S.C. 154(b) by 0 days.

(21) Appl. No.: 17/085,640

(22) Filed: Oct. 30, 2020

(30) Foreign Application Priority Data

Apr. 8, 2020 (CN) .......................... 202010267818.5

(51) Int. Cl.
| | | |
|---|---|---|
| *G11C 16/20* | (2006.01) | |
| *G11C 7/10* | (2006.01) | |
| *G11C 16/06* | (2006.01) | |
| *G11C 29/56* | (2006.01) | |
| *G06F 12/06* | (2006.01) | |
| *G06F 12/0891* | (2016.01) | |
| *G11C 29/14* | (2006.01) | |

(52) U.S. Cl.
CPC ........ *G11C 7/1063* (2013.01); *G06F 12/0638* (2013.01); *G06F 12/0891* (2013.01); *G11C 16/06* (2013.01); *G11C 16/20* (2013.01); *G11C 29/14* (2013.01); *G11C 29/56* (2013.01); *G06F 2212/7209* (2013.01); *G11C 2029/5602* (2013.01)

(58) Field of Classification Search
CPC ....... G11C 7/1063; G11C 29/56; G11C 16/06; G11C 29/14; G11C 2029/5602; G06F 12/0891; G06F 12/0638; G06F 2212/7209
See application file for complete search history.

(56) References Cited

U.S. PATENT DOCUMENTS

2010/0023819 A1* 1/2010 Beecher ......... G01R 31/318516
714/725

* cited by examiner

*Primary Examiner* — Jay W. Radke
(74) *Attorney, Agent, or Firm* — Birch, Stewart, Kolasch & Birch, LLP

(57) ABSTRACT

The invention introduces a non-transitory computer program product for activating a flash device when executed by a processing unit of the flash device to have program code to: determine whether the flash device is physically reset when the flash device enters a test mode perform an operation of a first phase for transmitting a very first message to a card-initialization host when the flash device is physically reset; and perform an operation of a second phase for searching a flash module for information referenced by In-System Programming (ISP) code, obtaining the ISP code from a designated address, and programming the ISP code into the flash module when the flash device is not physically reset.

20 Claims, 6 Drawing Sheets

COMPUTER PROGRAM PRODUCT AND METHOD AND APPARATUS FOR ACTIVATING FLASH DEVICES

CROSS-REFERENCE TO RELATED APPLICATIONS

This application claims the benefit of priority to Patent Application No. 202010267818.5, filed in China on Apr. 8, 2020; the entirety of which is incorporated herein by reference for all purposes.

BACKGROUND

The disclosure generally relates to storage devices and, more particularly, to computer program products, methods and apparatuses for activating flash devices.

Flash memory devices typically include NOR flash devices and NAND flash devices. NOR flash devices are random access-a host accessing a NOR flash device can provide the device any address on its address pins and immediately retrieve data stored in that address on the device's data pins. NAND flash devices, on the other hand, are not random access but serial access. It is not possible for NAND to access any random address in the way described above. Instead, the host has to write into the device a sequence of bytes which identifies both the type of command requested (e.g. read, write, erase, etc.) and the address to be used for that command. The address identifies a page (the smallest chunk of flash memory that can be written in a single operation) or a block (the smallest chunk of flash memory that can be erased in a single operation).

Flash devices usually need to complete card-initialization processes before being shipped from a manufacturing factory. The time spent in the card-initialization processes is an important issue in the production of the flash devices. Thus, it is desirable to have computer program products, methods and apparatuses to reduce time spent in the card-initialization processes for flash devices.

SUMMARY

In an aspect of the invention, a non-transitory computer program product for activating a flash device when executed by a processing unit of the flash device is introduced to have program code to: determine whether the flash device is physically reset when the flash device enters a test mode; perform an operation of a first phase for transmitting a very first message to a card-initialization host when the flash device is physically reset; and perform an operation of a second phase for searching a flash module for information referenced by In-System Programming (ISP) code, obtaining the ISP code from a designated address, and programming the ISP code into the flash module when the flash device is not physically reset.

In another aspect of the invention, a method for activating a flash device, performed by a flash controller of the flash device, is introduced to include: determining whether the flash device is physically reset when the flash device enters a test mode; performing an operation of a first phase for transmitting a very first message to a card-initialization host when the flash device is physically reset; and performing an operation of a second phase for searching a flash module for information referenced by ISP code, obtaining the ISP code from a designated address, and programming the ISP code into the flash module when the flash device is not physically reset.

In still another aspect of the invention, a read-only memory (ROM); a host interface (I/F); a flash IF; and a processing unit. The processing unit is arranged operably to load and execute the program code to perform operations with the ROM, the host I/F. and the flash I/F.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent." etc.)

Figure 1:
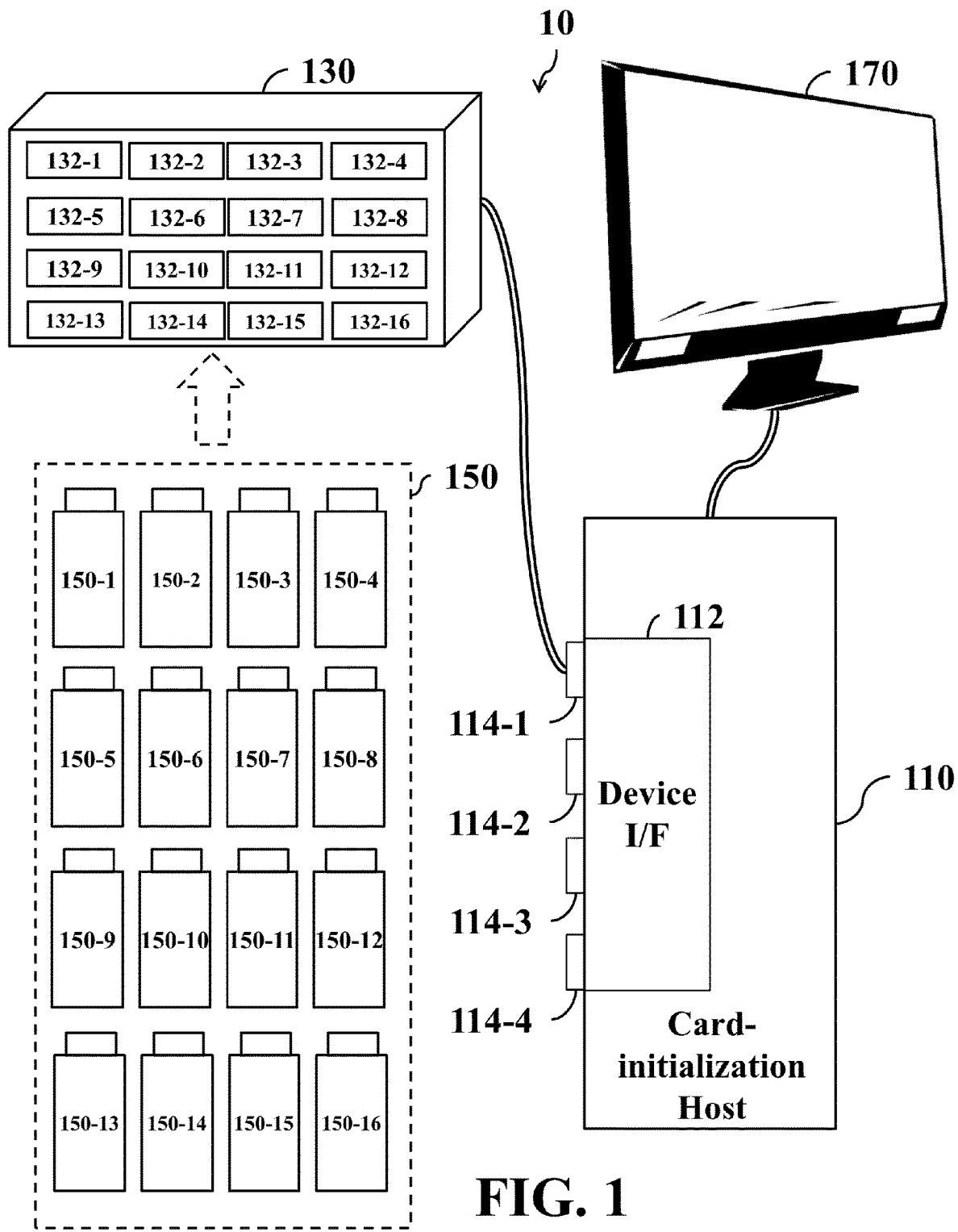
FIG. 1 is the system architecture for activating flash devices according to an embodiment of the invention.

Refer to FIG. 1. A card-activation system 10 include a card-initialization host 110, a hub 130, flash devices 150 and a displayer 170. The flash devices 150 may be portable drives, flash memory sticks, solid state disk (SSD) drives, or others, each of which contains a flash controller and a flash module. For each flash device 150, after the flash controller and the flash module are disposed on a motherboard, a card-initialization process needs to be completed before it can be shipped out from a manufacturing factory to a customer. The displayer 170 may be a Thin Film Transistor Liquid-Crystal Display (TFT-LCD) panel, an Organic Light-Emitting Diode (OLED) panel, a mini-LED panel, or others, to display input letters, alphanumeric characters and symbols, dragged paths, drawings, screens, or any combinations thereof in the card-initialization process for an engineer or an operator to view.

The card-initialization host 110 may be practiced in a Personal Computer (PC), a laptop PC, an industrial computer, a workstation. The card-initialization host 110 includes a device interface (I/F) 112 having ports 114-1 to 114-4 and each port may be connected to one hub, for example, the port 114-1 is connected to the hub 130. Although FIG. 1 depicts the device I/F 112 is equipped with only four ports, those artisans can equip the device I/F 112 with more or fewer ports, so that the card-initialization host 110 can be connected to more or fewer hubs and the invention should not be limited thereby. The hub 130 contains ports 132-1 to 132-16 and each port may be connected to one flash device 150, such as any of the flash devices 150-1 to 150-16. It should be noted that, for the brevity, when the disclosure is described using the singular form, the flash device 150, it means that the described structures, functions, process steps, other technical characteristics, or any combinations thereof can be applied to any of the flash devices 150-1 to 150-16. Although FIG. 1 depicts the hub 130 has sixteen ports, those artisans can connect a hub having more or fewer ports to the card-initialization host 110, so that the card-initialization host 110 can be connected to more or fewer flash devices and the invention should not be limited thereby. The card-initialization host 110 may communicate with the connected flash device 150 through the hub 130 using a communications protocol, such as Universal Serial Bus (USB), Advanced Technology Attachment (ATA), Serial Advanced Technology Attachment (SATA) Peripheral Component Interconnect Express (PCI-E) interface (I/F), or others, to complete a card-initialization process.

Figure 2:
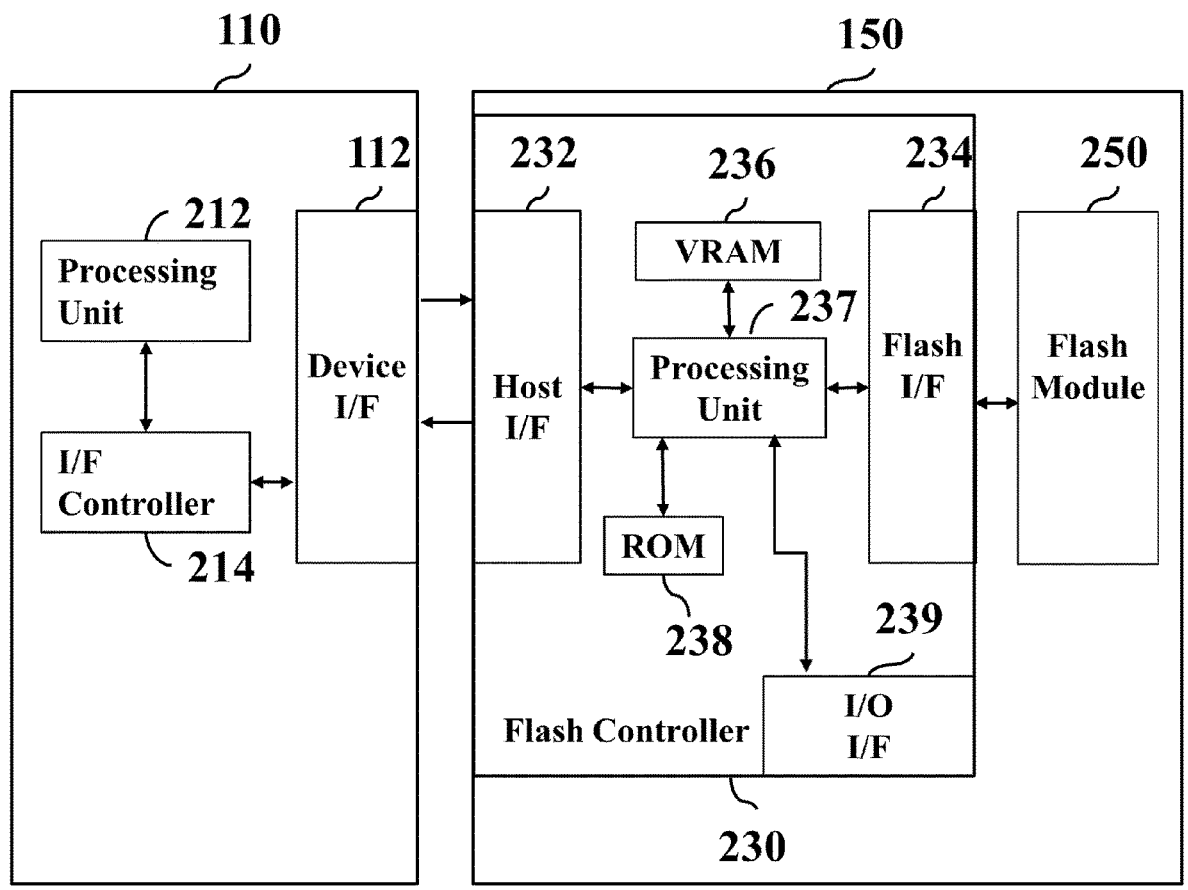
FIG. 2 is a block diagram of a card-initialization host and a flash device according to an embodiment of the invention.

Refer to FIG. 2. When the hub 130 is connected to a port on the device I/F 112 and the flash device 150 is plugged into the hub 130, it is equivalent to the flash device 150 being physically connected to the card-initialization host 110, so the hub 130 as shown in FIG. 1 is omitted from FIG. 2. The card-initialization host 110 includes a processing unit 212, which may be implemented in numerous ways, such as with general-purpose hardware (e.g., a single processor, a multiprocessor capable of parallel computations, a graphical processing unit, or others capable of the computation) that is programmed using software and/or firmware instructions, such as in a mass production (MP) tool, an operating system (OS), a driver, or others, to perform the functions recited herein. The processing unit 212 may issue an instruction to an I/F controller 214 for directing the I/F controller 214 to send a vendor command to the flash device 150 through the device I/F 112 to perform operations required in the card-initialization process. The vendor commands are not standard host-operation commands, such as administrative commands, management commands, Input/Output (I/O) commands, and the like, defined in Universal Flash Storage (UFS), Non-Volatile Memory Express (NVMe), Open-Channel SSD, or others, but proprietary commands defined by a manufacturer of the flash device 150 or the flash controller 230 and delivered to a client.

The flash device 150 includes a flash controller 230 and a flash module 250. The flash module 250 provides huge storage space, typically in hundred gigabytes (GBs) or even several terabytes (TBs), for storing huge user data, for example, high-resolution images, videos, or others. The flash module may include control circuits and a memory array. Memory units of the memory array may be configured as Single Level Cells (SLCs), Multi-Level Cells (MLCs), Triple Level Cells (TLCs), Quad-Level Cells (QLCs), or any combinations thereof.

The flash controller 130 includes a host I/F 232, a flash I/F 234, a volatile random access memory (VRAM) 236, a read-only memory (ROM) 238 and an input/output (I/O) I/F 239. The flash I/F 232 is coupled to the device I/F 112 of the card-initialization host 110. The flash I/F 234 is coupled to the flash module 250 and may communicate with each other using a double data rate (DDR) protocol, such as open NAND flash interface (ONFI), DDR Toggle, or others. The processing unit 237 may be practiced in the aforementioned general-purpose hardware. The ROM 238 stores program code when being loaded and executed by the processing unit 237 to perform functions required in the card-initialization process. The VRAM 236 temporarily stores data, such as variables, flags, data tables, etc., required in the card-initialization process.

Figure 3:
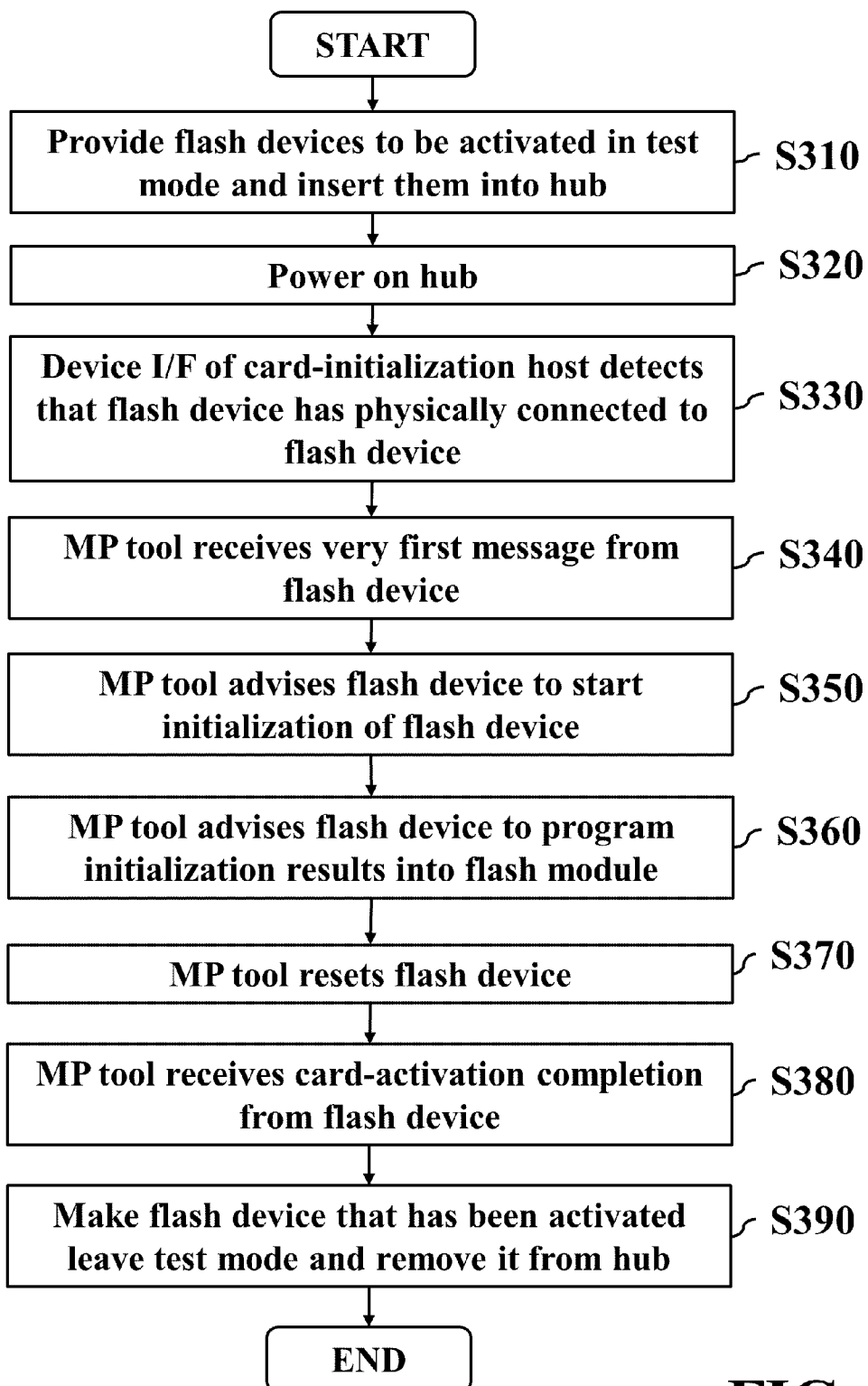
FIG. 3 is a flowchart illustrating a method for activating flash devices performed on production line according to an embodiment of the invention.

Refer to FIG. 3. First, an operator or engineer provides flash devices (for example, the flash devices 150-1 to 150-16) to be activated in the test mode and inserts them into the ports (for example, the ports 132-2 to 132-16) of the hub 130 (step S310), and then powers on the hub 130 (step S320).

Figure 4:
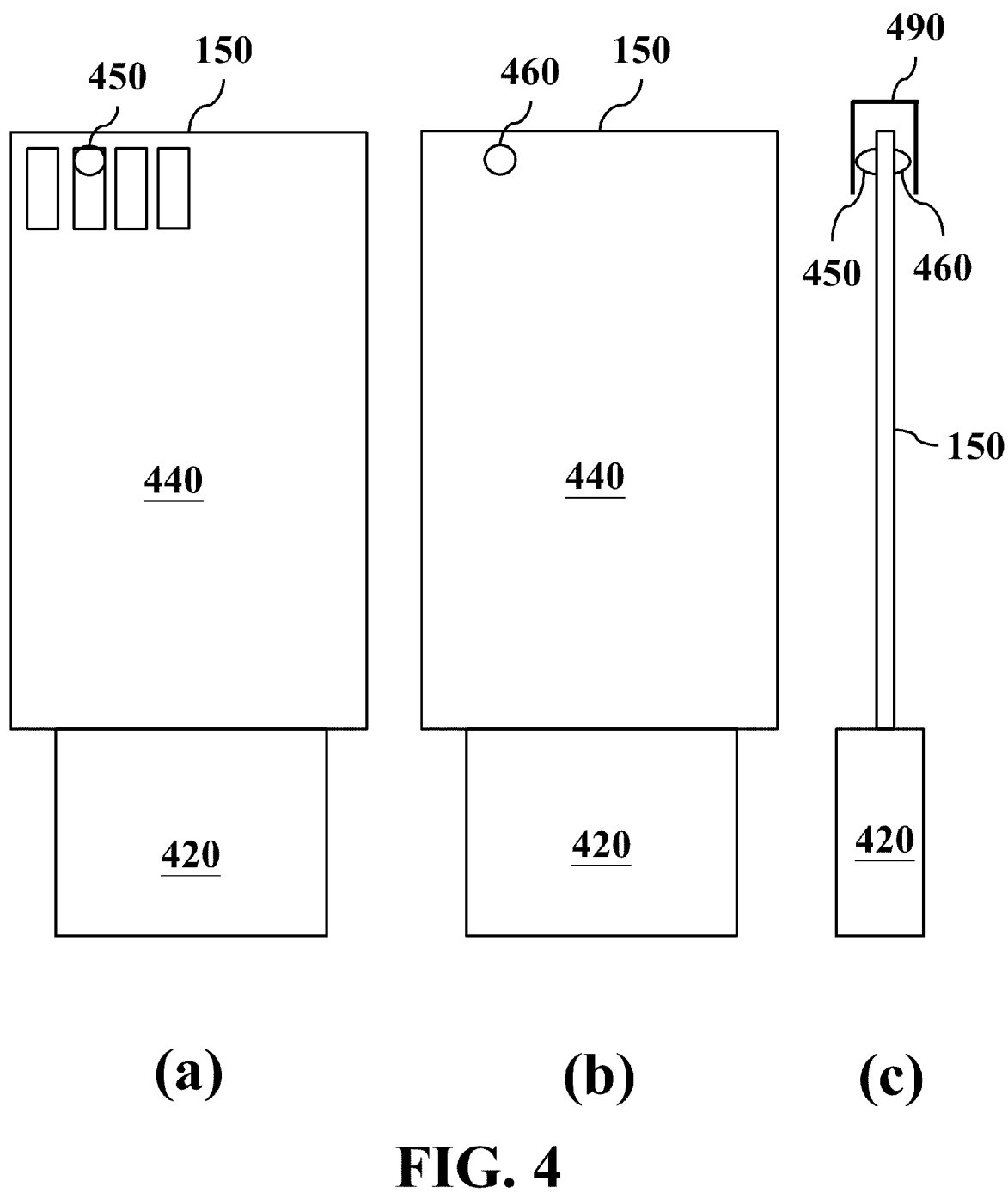
FIGS. 4 and 5 are schematic diagrams of flash devices according to embodiments of the invention.

In some embodiments, refer to FIG. 4. The flash device 150 includes a connector 420 and a motherboard 440. An integrated circuit (IC) is disposed on the motherboard 440, which includes the flash controller 230 and the flash module 250. Part (a) of FIG. 4 shows the front of the appearance of the flash device 150. A metal bump 450 is provided on one pin, for example one general-purpose input/output (GPIO) pin, on one end of the motherboard 440 away from the connector 420. The above pin is coupled to the I/O I/F 239. Part (b) of FIG. 4 shows the back of the appearance of the flash device 150. A metal bump 460 is provided on one end of the motherboard 440 away from the connector 420 to connect to a ground plane. In regular situations, the metal bumps 450 and 460 are separated. In order to put the flash device 150 to the test mode, the operator or engineer may place a metal cap 490 on the metal bumps 450 and 460 to make this pin grounded, so that the processing unit 237 can detect that the flash device 150 has entered the test mode through the I/O I/F 239.

Figure 5:
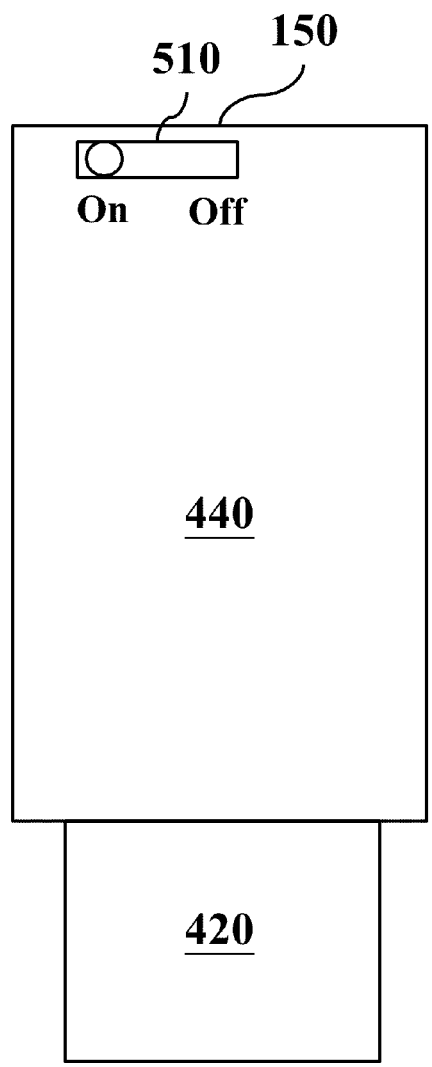

In alternative embodiments, refer to FIG. 5. A switch mechanism 510 may be set on the motherboard 440, coupled to the I/O I/F 239, so that the operator or engineer can toggle the pole in the switch mechanism 510 to let the processing unit 237 know the current state that the flash device 150 has entered. The processing unit 237 determines that the flash device 150 has entered the test mode when the pole in the switch mechanism 510 is positioned at the "On" state. The processing unit 237 determines that the flash device 150 has left the test mode when the pole in the switch mechanism 510 is positioned at the "Off" state. Those artisans know that when the hub 130 is powered on, the inserted flash device 150 is also powered on, so that the flash device 150 is electrically connected to the card-initialization host 110. Once the flash device 150 is powered on, the processing unit 237 loads and executes the instructions (also referred to as factory-mode code, which is the first code to be executed each time a physical- or code-reset is happened) in the ROM 238 from the beginning, which contains an instruction for replying to the card-initialization host 110 with a message (also called very first message) indicating the presence of the flash device 150. On the other hand, the processing unit 212 of the card-initialization host 110 executes a series of software instructions of a mass production (MP) tool to direct the flash device 150 to complete the card-initialization process in response to the presence of the flash device 150 (steps S340 to S380).

Specifically, after receiving the very first message from the flash device 150, which may include an identity (ID) of the flash device 150 (step S340), the MP tool issues a DEVICE INITIALIZATION vendor-command to the flash device 150 to advise the flash device 150 to start an initialization of the flash device 150 (step S350). The drive recognition is successful when the MP tool receives the very first message from the flash device 150. In addition to the factory-mode code described above, the processing unit 237 loads and executes program code (also referred to as vendor-command processing code) in the ROM 238 for processing vendor commands issued by the card-initialization host 110. To respond to the DEVICE INITIALIZATION vendor-command, the processing unit 237 when executing the vendor-command processing code may perform a series of tests to the flash module 250 through the flash I/F 234 for discovering bad blocks, bad columns, or others, and generating a bad-block table, a bad-column table, or others accordingly. The vendor-command processing code may calculate the length of each physical page that can be used to store the Error Check and Correction (ECC) code based on parameters, such as the detected number of bad columns, etc. The vendor-command processing code may calculate the start position of each sector of each physical page based on information, such as the detected number of bad columns, the ECC length, etc., and generate a sector start table accordingly. The vendor-command processing code may calculate a logical block address (LBA) quantity for the storage of the flash module 250 according to information, such as the detected bad-block number, the detected bad-column number, the ECC length, etc. The vendor-command processing code may store information about the tables, variables, and others, as described above in the VRAM 236 and drive the host I/F 232 to reply to the card-initialization host 110 with an idealization completion for informing the MP tool. The MP tool may display a message about the initialization completion on the displayer 170 to prompt the operator or engineer.

After receiving the initialization completion from the flash device 150, which includes information about the LBA quantity of storage that the flash module 250 can provide, the MP tool issues a DOWNLOAD INFO vendor-command to the flash device 150 for directing the flash device 150 to store the initialization results in non-volatile storage space, such as the flash module 250 (step S360). To respond to the DOWNLOAD INFO vendor-command, the processing unit 237 when executing the vendor-command processing code programs information about the data tables, the variables, and so on, stored in the VRAM 236 into a system block of the flash module 250 through the flash I/F 234. Those artisans may realize that the information about the data tables, the variables, and so on generated in step S350 will be referenced by In-System Programming (ISP) code when being executed. The ISP code includes operations for executing host commands issued by a host, such as host read, write, erase commands, etc. The host commands are specified by standard development organizations, such as UFS, NVMe, and Open-channel SSD commands. The vendor-command processing code may drive the host I/F 232 to reply to the card-initialization host 110 with a download completion for informing the MP tool. The MP tool may display a message about the download completion on the displayer 170 to prompt the operator or engineer.

After receiving the download completion from the host device 150, the MP tool issues a DEVICE RESET vendor-command to the host device (step S370). Once the DEVICE RESET vendor-command is received (that is, a triggering of a code reset), the processing unit 237 loads and executes the factory-mode code from the beginning for searching information stored in the flash module 250, which can be referenced by the ISP code, obtaining the ISP code from a designated address, driving the flash I/F 234 to program the ISP code into a designated physical block of the flash module 250, and driving the host I/F 232 to reply to the card-initialization host 110 with a card-initialization completion for informing the MP tool.

After receiving the card-initialization completion from the flash device 150 (step S380), the MP tool may display a message about the card-initialization completion on the displayer 170 to prompt the operator or engineer. Subsequently, the operator or engineer may make the flash device 150 that has been activated leave the test mode and remove it from the hub 130 (step S390). In some embodiments with references made to part (c) of FIG. 4. The operator or engineer may remove the metal cap 490, so that the metal bumps 450 and 460 are not electrically connected to each other and the flash device 150 leaves the test mode. In alternative embodiments with references mad to FIG. 5. The operator or engineer may pull the pole in the switch mechanism 510 to the "Off" state, so that the flash device 150 leaves the test mode.

In some implementations, after the flash device is powered on (step S320), the processing unit 237 when executing the factory-mode code firstly searches through the flash I/F 234 at the specified location of the flash module 250 for information referenced by the ISP, and sends the very first message to the card-initialization host 110 when it hasn't been found within a preset time. However, in the meantime, the flash module 250 of the flash device 150 is empty and does not store any available information, so that the processing unit 237 spends an unnecessary time period for searching information that is not exist. Even worse, although the device I/F 112 can know the presence of the flash device 150 when the flash device 150 is physically connected to the card-initialization host 110, the MP tool issues the DEVICE RESET vendor-command to the flash device 150 when the MP tool hasn't received the very first message from the flash device 150 within a preset time period, so that the search is interrupted and the factory-mode code is executed from the beginning again. Because of these unnecessary DEVICE RESET vendor-commands, the time for the MP tool to receive the very first messages from the flash devices 150-1 to 150-16 are extended, for example, it takes two to three minutes.

Figure 6:
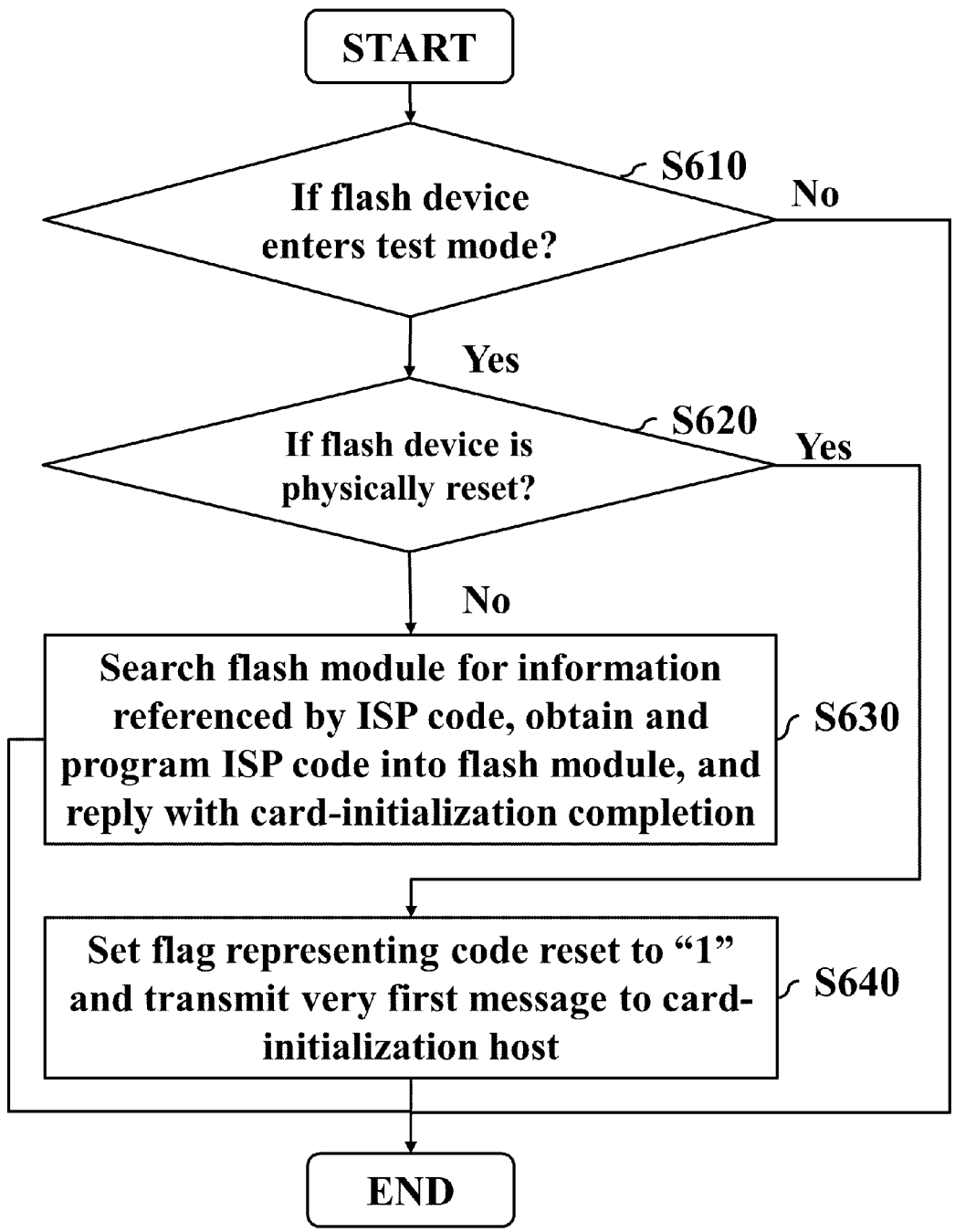
FIG. 6 is a flowchart illustrating a method for activating a flash device, performed by a processing unit of the flash device when executing factory-mode code, according to an embodiment of the invention.

To improve the drawbacks of the aforementioned implementations, refer to a flowchart of a method for activating flash devices, which is performed when the processing unit 237 executes the factory-mode code, as shown in FIG. 6. An embodiment of the invention divides the whole flash-device activation method into two phases: The first phase is to transmit the very first message to the card-initialization host 110 efficiently. The second phase is to search the flash module 250 for information referenced by the ISP code and program the ISP code into the flash module 250. The factory-mode code may recognize that the flash device 150 is in which phase currently according to a code-reset flag.

Specifically, the processing unit 237 when executing the factory-mode code firstly determines whether the flash device 150 enters the test mode (step S610). With the references made to the hardware configurations as shown in FIG. 4, the factory-mode code may complete the determination by detecting whether the designated pin is grounded through the/O I/F 239. With the references made to the hardware configurations as shown in FIG. 5, the factory-mode code may complete the determination by detecting which location the pole in the switch mechanism 510 is positioned currently through the I/O I/F 239.

When determining that the flash device 150 enters a test mode (the "Yes" path of step S610), the factory-mode code further determines whether the flash device 150 is physically reset (step S620). The factory-mode code may determine whether a code-reset flag stored in the VRAM 236 is "1". Those artisans realize that data stored in the VRAM 236 is gone after the VRAM 236 is powered down or off. Thereafter, data stored in the VRAM 236 is all gone and the factory-mode code gets a negative result (i.e. meaning that the flash device 150 has been physically reset) in the judgment after the flash device 150 is physically reset. Otherwise, data stored in the VRAM 236 is maintained and the factory-mode code may get a positive result (i.e. meaning that the flash device 150 hasn't been physically reset) in the judgment after the flash device 150 is not physically reset (also referred to being reset by code).

When determining that the flash device 150 is physically reset (the "Yes" path of step S620), the factory-mode code sets the code-reset flag stored in the VRAM 236 to "1" and drives the host I/F 232 to transmit the very first message to the card-initialization host 110 (step S640). With the judgment as described above, the factory-mode code can enter the first phase when the flash device 150 is physically reset to quickly transmit the very first message to the card-initialization host 110, avoiding to search the empty flash module 250, which causes the technical problems happened in the implementations as described above. In other words, the factory-mode code does not perform any operation of the second phase when the flash device 150 is physically reset to avoid delaying to transmit the very first message to the card-initialization host 110.

When determining that the flash device 150 is not physically reset (the "No" path of step S620), the factory-mode code drives the flash I/F 230 to search the flash module 250 for information referenced by the ISP code, obtains the ISP code from a designated address, drives the flash I/F 230 to program the ISP code into a designated address of the flash module 250, and drives the host IF 232 to reply with a card-initialization completion to the card-initialization host 110 (step S630). In other words, step S630 includes operations required in the second phase.

Some or all of the aforementioned embodiments of the method of the invention may be implemented in a computer program such as a driver or a firmware program for a dedicated hardware, a software application program, or others, or any combinations thereof. Since the implementation of the various embodiments of the present invention into a computer program can be achieved by the skilled person using his routine skills, such an implementation will not be discussed for reasons of brevity. The computer program implementing some or more embodiments of the method of the present invention may be stored on a suitable computer-readable data carrier such as a DVD, CD-ROM, USB stick, a hard disk, which may be located in a network server accessible via a network such as the Internet, or any other suitable carrier.

Although the embodiment has been described as having specific elements in FIGS. 1 to 2, it should be noted that additional elements may be included to achieve better performance without departing from the spirit of the invention. Each element of FIGS. 1 to 2 is composed of various circuits and arranged operably to perform the aforementioned operations. While the process flows described in FIGS. 3 and 6 include a number of operations that appear to occur in a specific order, it should be apparent that these processes can include more or fewer operations, which can be executed serially or in parallel (e.g., using parallel processors or a multi-threading environment).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A non-transitory computer program product for activating a flash device when executed by a processing unit of the flash device, the non-transitory computer program product comprising program code to:
   determine whether the flash device is physically reset when the flash device enters a test mode;
   perform an operation of a first phase for transmitting a very first message to a card-initialization host when the flash device is physically reset; and
   perform an operation of a second phase for searching a flash module for information referenced by In-System Programming (ISP) code, obtaining the ISP code from a designated address, and programming the ISP code into the flash module when the flash device is not physically reset.

2. The non-transitory computer program product of claim 1, comprising program code to:
   perform no operation of the second phase when the flash device is physically reset to avoid delaying to transmit the very first message to the card-initialization host.

3. The non-transitory computer program product of claim 1, wherein the ISP code comprises operations for executing a host command issued by a host.

4. The non-transitory computer program product of claim 1, wherein a code-reset flag stored in a volatile random access memory is detected to determine whether the flash device is physically reset.

5. The non-transitory computer program product of claim 1, comprising program code to:
   determine that the flash device enters the test mode when detecting a pin is grounded through an Input/Output interface.

6. The non-transitory computer program product of claim 1, comprising program code to:
   determine that the flash device enters the test mode when detecting a pole in a switch mechanism is positioned at a specific location through an Input/Output interface.

7. The non-transitory computer program product of claim 1, comprising program code to:
   perform a series of tests to the flash module, generate information that is referenced by the ISP code in execution according to test results, and program the information into the flash module between the first phase and the second phase.

8. A method for activating a flash device, performed by a flash controller of the flash device, comprising:
  determining whether the flash device is physically reset when the flash device enters a test mode;
  performing an operation of a first phase for transmitting a very first message to a card-initialization host when the flash device is physically reset; and
  performing an operation of a second phase for searching a flash module for information referenced by In-System Programming (ISP) code, obtaining the ISP code from a designated address, and programming the ISP code into the flash module when the flash device is not physically reset.

9. The method of claim 8, comprising:
  performing no operation of the second phase when the flash device is physically reset to avoid delaying to transmit the very first message to the card-initialization host.

10. The method of claim 8, wherein the ISP code comprises operations for executing a host command issued by a host.

11. The method of claim 8, wherein a code-reset flag stored in a volatile random access memory is detected to determine whether the flash device is physically reset.

12. The method of claim 8, comprising:
  performing a series of tests to the flash module, generating information that is referenced by the ISP code in execution according to test results, and program the information into the flash module between the first phase and the second phase.

13. A flash device, comprising:
  a read-only memory (ROM), arranged operably to store a program code;
  a host interface (I/F), coupled to a flash module;
  a flash I/F, coupled to a card-initialization host; and
  a processing unit, coupled to the ROM, the host IF and the flash I/F, arranged operably to load and execute the program code,
  wherein the program code is executed to:
  determine whether the flash device is physically reset when the flash device enters a test mode;
  perform an operation of a first phase for transmitting a very first message to a card-initialization host through the host I/F when the flash device is physically reset; and
  perform an operation of a second phase for searching a flash module for information referenced by In-System Programming (ISP) code through the flash I/F, obtaining the ISP code from a designated address, and programming the ISP code into the flash module through the flash I/F when the flash device is not physically reset.

14. The flash device of claim 13, wherein the program code is executed to:
  perform no operation of the second phase when the flash device is physically reset to avoid delaying to transmit the very first message to the card-initialization host.

15. The flash device of claim 13, wherein the ISP code comprises operations for executing a host command issued by a host.

16. The flash device of claim 13, comprising:
  a volatile random access memory (VRAM), coupled to the processing unit, arranged operably to store a code-reset flag;
  wherein the program code is executed to:
  determine whether the flash device is physically reset by detecting the code-reset flag,
  wherein the code-reset flag stored in the VRAM is gone after the flash device is powered down or off.

17. The flash device of claim 13, wherein the program code is executed to:
  set the code-reset flag to "1" to indicate that the flash device is reset by code when the flash device is physically reset.

18. The flash device of claim 13, comprising:
  an Input/Output (I/O) I/F, coupled to the processing unit and a pin,
  wherein the program code is executed to:
  determine that the flash device enters the test mode when detecting the pin is grounded through the I/O I/F.

19. The flash device of claim 13, comprising:
  an Input/Output (I/O) I/F, coupled to the processing unit and a switch mechanism,
  wherein the program code is executed to:
  determine that the flash device enters the test mode when detecting a pole in the switch mechanism is positioned at a specific location through the I/O I/F.

20. The flash device of claim 13, wherein the code is executed to:
  perform a series of tests to the flash module through the flash I/F, generate information that is referenced by the ISP code in execution according to test results, and program the information into the flash module through the flash I/F between the first phase and the second phase.

* * * * *